(12) United States Patent
Giduturi

(10) Patent No.: US 11,972,147 B2
(45) Date of Patent: Apr. 30, 2024

(54) MEMORY DIE STACK CHIP ID-BASED COMMAND STRUCTURE

(71) Applicant: Micron Technology, Inc., Boise, ID (US)

(72) Inventor: Hari Giduturi, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 191 days.

(21) Appl. No.: 17/723,773

(22) Filed: Apr. 19, 2022

(65) Prior Publication Data
US 2023/0333778 A1    Oct. 19, 2023

(51) Int. Cl.
*G06F 3/06*     (2006.01)

(52) U.S. Cl.
CPC .......... *G06F 3/0659* (2013.01); *G06F 3/0604* (2013.01); *G06F 3/0679* (2013.01)

(58) Field of Classification Search
CPC .... G06F 3/0659; G06F 3/0604; G06F 3/0679; G11C 7/00
See application file for complete search history.

(56) References Cited

U.S. PATENT DOCUMENTS

| | | | |
|---|---|---|---|
| 2019/0102330 A1* | 4/2019 | Hasbun | G11C 5/02 |
| 2019/0103149 A1* | 4/2019 | Hasbun | G11C 11/4093 |
| 2021/0224195 A1* | 7/2021 | O | G06F 12/0292 |
| 2023/0333778 A1* | 10/2023 | Giduturi | G06F 3/0659 |
| 2023/0335165 A1* | 10/2023 | Giduturi | G11C 7/20 |
| 2023/0335176 A1* | 10/2023 | Giduturi | G11C 11/4076 |

* cited by examiner

*Primary Examiner* — Hiep T Nguyen
(74) *Attorney, Agent, or Firm* — Schwegman Lundberg & Woessner, P.A.

(57) ABSTRACT

A memory system can include a stack of memory dies such as including a primary die and two or more secondary dies. The primary die can communicate with an external host device and with the secondary dies. In an example, the primary die can issue a command to the secondary dies using a first command message that includes an opcode field specifying a memory operation, a first chip identification field specifying a selected first die of the secondary dies, and one or more operands. In an example, each of the secondary dies receives the same first command message.

25 Claims, 9 Drawing Sheets

MEMORY DIE STACK CHIP ID-BASED COMMAND STRUCTURE

BACKGROUND

A computing system includes processing circuitry, such as one or more processors or other suitable components, and can include one or more memory devices or circuits. A memory device can comprise a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include instructions executable by the processing circuitry to perform an operation and/or may include data to be used as an input for such operation. In an example, data output from the operation may be stored in memory, such as to enable subsequent retrieval of the data from the memory.

Some memory devices include memory cells that can be accessed by turning on a transistor that couples the memory cell (e.g., a capacitor) with a word line or a bit line. In other devices, such as threshold-type memory devices, access can be provided using a voltage across a memory cell, and the data value is stored and/or retrieved based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell. Moreover, the data value may be retrieved or read by applying sufficient voltage to allow access to the stored voltage of the memory cell. One example of a threshold-type memory cell includes a cross-point memory cell (Xpoint memory cell).

Gains in memory density have been achieved through the inclusion of additional memory on a given die. One technique to increase density of a memory die includes physically layering or stacking multiple memory dies into a stacked array, and the stacked array can be packaged together.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
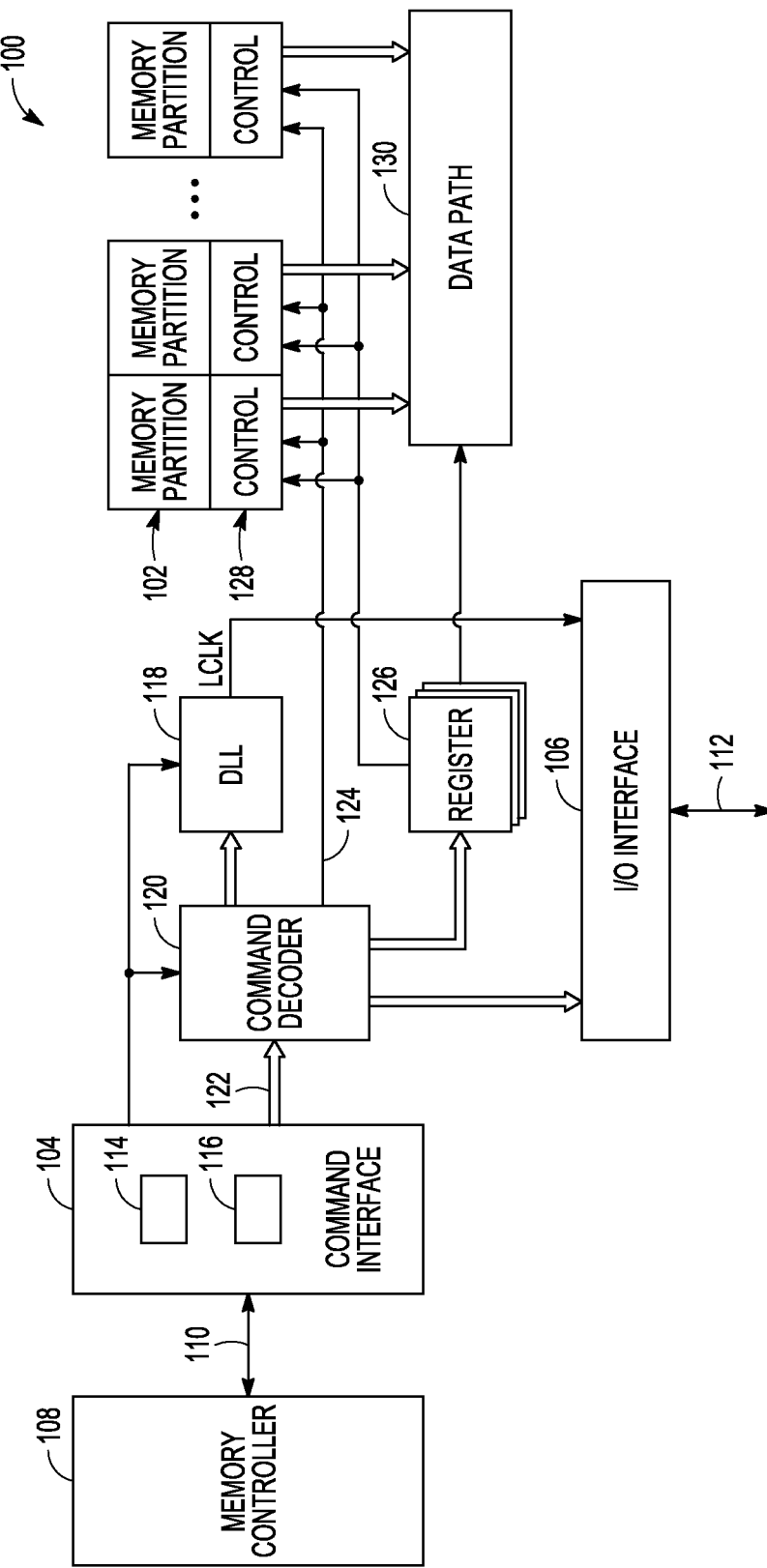
FIG. 1 illustrates generally an example block diagram of a memory device.

One solution to increase memory capacity of a memory device includes using stacked memory dies, for example, in a single package. To maintain high throughput, it can be beneficial for a front end interface (FEI) path between a host device and a memory device to be fully saturated at a maximum interface speed capability of the memory device. However, with multiple-die memory stacks, maintaining such throughput can be difficult.

In some embodiments, a stacked memory, or memory die stack, can include a primary memory die and one or more secondary memory dies. Inter-die communication between the primary memory die and the secondary memory die(s) can use an intra-package bus that is internal to the package, and the host device only directly interfaces with the primary memory die of the memory stack. That is, in some examples, an external host device may not see or directly communicate with one or more secondary memory dies of a memory die stack, and instead only a designated primary memory die in a package communicates with the external host device. In an example, the intra-package bus includes channels or paths between the primary memory die and the internal (secondary) dies and can be completely internal to the memory device package.

As the number of dies in a stacked memory device increases, various issues can arise. For example, a problem with stacked memory devices can include internal connection delays (e.g., bond wire delay) between the primary memory die and one or more secondary memory dies (e.g., the secondary die farthest in distance from the primary memory die) can be substantial, and can affect clocking of signals into and/or out of the secondary memory die. Likewise, different dies in a memory stack can be formed from different skew corners, which can lead to differences in, for example, complementary metal-oxide-semiconductor (CMOS) process times. Furthermore, timing of the flow of signals (e.g., data) on the internal buses in relation to external interface speed can overlay (due to variable delays in the memory stack), which in turn can cause timing failures due to signal collisions (e.g., timings of data packets may not be in sync with the interface clock). In short, as memory stacks are employed, there can be resultant delays due to, for example, the position of the dies in the package and CMOS process skew of the memory dies.

The present inventor has recognized that a problem with stacked memory devices can include maintaining high throughput and maximizing interface speeds with an external memory host device. The problem can include, for example, load capacitance effects that interfere with, or diminish, signal transmission or transaction speed on a shared bus. For example, the present inventor has recognized that coupling multiple dies to a common interface node increases node capacitance and signal integration times, and therefore can reduce throughput.

The present inventor has recognized that a solution to the throughput problem can include or use a stacked memory device with an intra-package bus that couples a primary die to multiple secondary dies in the memory package. The device can use an intra-package communication protocol that enables high concurrency with reduced capacitive loading.

For example, each die in the memory device package can have its own configurable device identification or chip ID. In an example, each die can support multiple chip IDs, which in turn can help improve manufacturing efficiency and enable more flexibility to a host device. In an example, the intra-package communication protocol can include or use messages that include the chip ID as a part of a command packet. Each secondary die in the package can be configured to receive the command packet from the primary die and each receiving die can make its own independent decision about whether or when to receive and process the command packet. In an example, the intra-package bus can be configured to operate at the same speed or a reduced speed relative to the bus that couples the primary die to the external host device.

In an example, the solution to the throughput problem can include or use the chip ID as a multiple-clock cycle portion of a command packet. A multiple-bit (e.g., corresponding to multiple clock cycles) command input packet can be more efficient relative to other chip addressing techniques because it can use fewer pins or channels in the communication bus, for example between the host device and a primary die of a memory device, or between the primary die and the secondary dies in the memory device package.

In an example, the solution can further include using the primary die to issue a command packet, for communication to multiple secondary dies using a shared, intra-package bus, that includes an opcode field specifying a memory operation, a chip ID specifying a selected die of multiple secondary dies in one device package, and one or more operands. Using this message communication protocol, a single command packet can be used to initiate execution of any memory command that can be specified in the opcode field. In an example, the solution can support variable command/address (CA) input cycle lengths, which in turn can further enhance bus efficiency for data input and output.

The present inventor has recognized that a problem with memory devices, including stacked memory devices that include multiple dies, can include facilitating device-level or die-level standby entry and standby exit. The problem can include avoiding standby entry or exit procedures that are not synchronous, such as can consume several clock cycles, for example with dedicated WAKE or chip select (CS) signals and sequences. In an example, the problem can further include, in some situations, pausing activity on a command/address bus for any and all active die on the shared bus. That is, the problem can include inhibiting activity by any die that is not in a standby or low power mode, which in turn can tie up the bus and compromise device efficiency.

In an example, a solution to the standby entry and exit problem can include or use an opcode-based standby command structure. For example, the solution can include a two-cycle standby exit command. Each die in a multiple-die stacked memory device can include or use a separate logic unit that is awake in standby mode and listens to a shared command/address (CA) bus. Using opcode-based commands, standby exit sequences can be interspersed with other commands to active die(s) that share the CA bus. In an example, opcode-based commands can enable issuance of multiple standby exit commands, such as for respective multiple dies, that are cascaded back-to-back.

FIG. 1 illustrates generally a simplified block diagram of various features of a memory device 100. The block diagram of FIG. 1 can be a functional block diagram illustrating various functions of the memory device 100. In accordance with one embodiment, the memory device 100 may be a random access memory (RAM) device, a dynamic RAM (DRAM) device, a static RAM (SRAM) device (including a double data rate SRAM device), flash memory, and/or a phase change memory (PCM) device and/or other chalcogenide-based memory, such as self-selecting memories (SSM). Moreover, the memory cells of the memory device can each have a corresponding logic storing device (e.g., a capacitor, a resistor, or a chalcogenide device).

In some examples, the memory device 100 comprises a PCM device such as a 3D XPoint memory device, such as including a non-volatile memory that uses chalcogenide material(s) to allow for state changes of memory cells therein. The changing of one state to another, for example from a crystalline phase (e.g., an orderly phase of the material of the memory cells of the PCM device), having a relatively low resistance, to an amorphous phase (e.g., a disorderly phase of the material of the memory cells of the PCM device), having relatively high resistance, can be controlled through the application of, for example, heat to the materials of the PCM. The states themselves, based on their differences in resistivity, represent whether the phase change memory cell stores "1" or "0" as a binary value.

In an example, the memory device 100 comprises a cell, or array of cells, arranged according to a planar architecture, with discrete cells or memory elements located at crossings of Word Lines (WL) and Bit Lines (BL). In some examples, a memory element comprising chalcogenide materials can be provided at such WL and BL crossings, and can behave both as a selector and a memory element. In a two-dimensional array, alternating decks of WL and BL can be provided or layered to provide a 3D memory array. The different deck levels can be formed by, for example, depositing a layer of WL conductive material, bottom electrode material, chalcogenide material, and top electrode material; patterning the array in the WL direction by etching trenches to thereby insulate the WL lines; sealing the cell sidewalls, and filling trenches to insulate adjacent WL lines. Next, BL material can be deposited and patterned, such as primarily in a direction that is perpendicular to the WL direction, including etching trenches to define BL lines, such as through top electrode, chalcogenide, and bottom electrode materials, to form BL lines with memory "pillars" that are insulated in each lateral direction. Such cells can exploit particular charge storage behaviors of some chalcogenide materials. For example, chalcogenide materials can have a relatively high resistance characteristic up to a threshold voltage at which the material can "snap" and become significantly less resistive and can thereby drain a current rapidly. In an example, depending on the polarity of a prior "snap" event in the material, the absolute value of the threshold voltage can change, and therefore can allow for a memory storage effect. In other words, the cell comprising a chalcogenide material can be set, or placed in a low Vt state, in one polarity, and the same cell may be reset, or placed in a high Vt state, using an opposite polarity. Further, if a read polarity for a chalcogenide cell is reversed, then the absolute threshold voltage of the cell can reverse. For example, a low threshold voltage Vt under a positive polarity read can result in a higher threshold voltage Vt under a negative polarity read, and vice versa.

The memory device 100 can include memory partitions 102, and each memory partition 102 can include one or more cell arrays (i.e., memory arrays), such as comprising chalcogenide materials. Various configurations, organizations, and sizes of a memory partition 102 on the memory device 100 can be used depending on the application and design of the overall system. For example, each of the memory partitions 102 can comprise a respective different die in a stacked memory device. In such a device, at least one die can be a primary die that interfaces with a host, or a memory controller 108, using an inter-device bus 110, and one or more other dies can be secondary dies that interface with the primary die using an intra-package bus 124.

The memory device 100 can include a command interface 104 and an input/output interface 106. The command interface 104 can receive various signals from an external host device, such as a processor or controller (e.g., a memory controller 108) external to the memory device 100. In some embodiments, an inter-device bus 110 (or a signal path or a group of signal paths) can, individually or in combination, allow for bidirectional transmission of signals between the command interface 104 and the processor or controller (e.g., the memory controller 108).

In an example, the memory device 100 can include a second bus 112 (or a signal path or another group of signal paths) that can, individually or in combination, allow for bidirectional transmission of signals, including, for example, data signals, between the input/output interface 106 and, for example, the processor or controller (e.g., the memory controller 108). Thus, the processor or controller, for example, the memory controller 108, can provide various signals to the memory device 100 to facilitate transmission and receipt of data to be written to or read from the memory device 100.

In an example, the command interface 104 can include or use a number of circuits, such as a clock input circuit 114 and a command/address input circuit 116, to ensure proper handling of the received signals. The command interface 104 can receive one or more clock signals from an external device, such as the memory controller 108. The command interface 104 can receive commands (e.g., read command, write command, etc.), that can be entered on, e.g., positive edges of the clock signal, and can receive data, such as can be transmitted or received on positive and/or negative edges of the clock signal. In some examples, the commands can have a variable clock length (e.g., one or more clocks can be used to receive the commands).

The clock input circuit 114 can receive the one or more clock signals and generate an internal clock signal CLK therefrom. In some embodiments, the internal clock signal CLK is supplied to an internal clock generator 118, such as a delay locked loop (DLL) circuit. The internal clock generator 118 generates a phase-controlled internal clock signal LCLK based on the received internal clock signal CLK. The phase controlled internal clock signal LCLK can be provided to the input/output interface 106, for instance, and can be used as a timing signal for determining an output timing of read data.

The internal clock signal CLK can be provided to various other components within the memory device 100 and can be used to generate various additional internal clock signals. For instance, the internal clock signal CLK can be provided to a command decoder 120. The command decoder 120 can receive command signals from the command bus 122 and can decode the command signals to provide various internal commands. For example, the command decoder 120 can provide command signals to the internal clock generator 118 using an internal bus to coordinate generation of the phase-controlled, internal clock signal LCLK. In some examples, the phase-controlled, internal clock signal LCLK can be used to clock data through the input/output interface 106. In an example, a frequency of the internal clock signal CLK can be less than a frequency of a clock signal used by the memory controller 108 to communicate via the inter-device bus 110.

In an example, the command decoder 120 can decode commands, such as read commands, write commands, register set commands, activate commands, etc., and provide access to a particular one of the memory partitions 102 corresponding to the command, such as via an intra-package bus 124. The command decoder 120 can transmit various signals to one or more registers 126 via a bus path (e.g., one or more global wiring lines). In an example, the memory device 100 can include various other decoders, such as row decoders and column decoders, to facilitate access to the various memory partitions 102. In one embodiment, each memory partition 102 can include a respective control block 128 that provides decoding (e.g., row and/or column decoding), as well as other features, such as timing control and data control, to facilitate the execution of commands to and from the respective memory partition 102.

In an example, the command decoder 120 or other component in the memory device 100 can provide register commands to the one or more of the registers 126, which can be used in operations of each of the memory partitions 102, each control block 128, and the like. For example, one of the registers 126 can define various modes of programmable operations and/or configurations of the memory device 100. The registers 126 can be included in semiconductor devices to define operations for various types of memory components, such as DRAM, synchronous DRAM, chalcogenide memories (e.g., PCM) or other types of memories. The registers 126 can receive various signals from the command decoder 120 via wiring lines that can include a common data path, a common address path, a common write command signal path, or a common read command signal path. The wiring lines can traverse the memory device 100 and couple to each register 126.

The registers 126 can be accessed or otherwise accessible by the memory controller 108. The registers 126 can be dispersed across the memory device 100 and the registers can represent or contain information such as configuration settings of the memory device 100 and/or specific components therein, status information about the memory device 100 and/or specific components therein, memory device 100 parameters and/or specific parameters for components of the memory device 100, or predetermined patterns that can be written across the memory device (e.g., in one or more of the memory partitions 102). Thus, while the registers 126 are illustrated in FIG. 1, it should be appreciated that additional and/or alternative registers can be located elsewhere in the memory device and can be accessed by the memory controller 108 (i.e., when in operation, the registers are accessed by the memory controller 108). Such accesses by the memory controller 108 can include, for example, reads of the registers (e.g., read accesses) and/or writes to the registers (e.g., write accesses).

In an example, the memory device 100 executes operations, such as read commands and write commands, based on the command/address signals received from an external device, such as a processor and/or by the memory controller 108. In one example, command/address signals are clocked to the command interface 104 using clock signals. The command interface 104 can include a command/address input circuit 116 that is configured to receive and transmit the commands to provide access to the memory partitions 102, through the command decoder 120. The command interface 104 can receive memory select signals that enable the memory device 100 to process commands on the incoming command/address signals. Access to specific memory partitions 102 within the memory device 100 can be encoded in the commands.

The command interface 104 can be configured to receive various other command signals. For example, a reset command can be used to reset the command interface 104, status registers, state machines and the like, during power-up or standby exit, for instance. Various signals to facilitate testing of the memory device 100 may be provided. For instance, test signals can be used to place the memory device 100 into a test mode for connectivity testing. The command interface 104 can be used to provide an alert signal or other alarm signal to the system processor or controller for certain errors that may be detected. In some embodiments, the input/output interface 106 can additionally or alternatively transmit an alert signal, for example, a thermal alert.

Data can be sent to and from the memory device 100 using the command and clocking signals discussed above, for example, by transmitting and receiving data signals through the input/output interface 106. More specifically, the data can be sent to or retrieved from the memory partitions 102 over a data path 130, such as can include multiple bidirectional data buses. Data I/O signals, for example, can be transmitted and received in one or more bidirectional data busses to and from the input/output interface 106. For particular memory devices, such as a DDR5 SDRAM memory device, the I/O signals can be divided into upper and lower bytes; however, such segmentation is generally not used for other memory device types.

As will be appreciated, various other components such as power supply circuits (for receiving external VDD and VSS signals), read/write amplifiers (to amplify signals during read/write operations), temperature sensors (for sensing temperatures of the memory device 100), etc., can be incorporated with the memory device 100. Accordingly, it should be understood that the block diagram of FIG. 1 is only provided to highlight certain functional features of the memory device 100 to aid in the subsequent detailed description.

Figure 2:
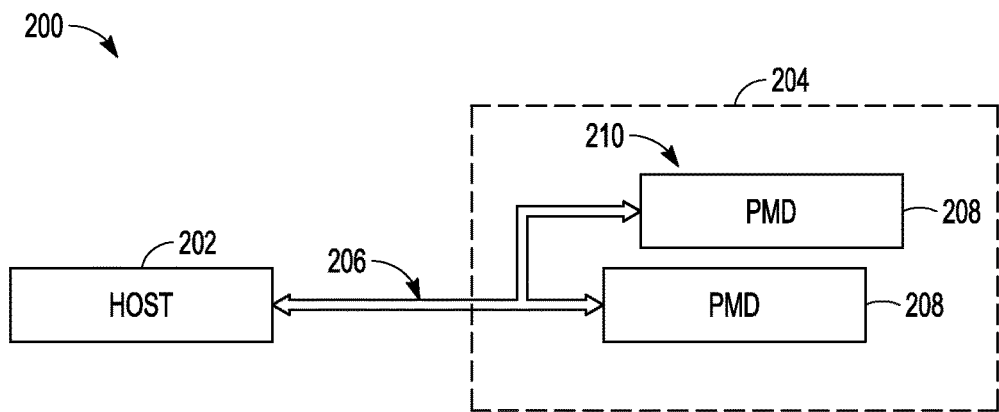
FIG. 2 illustrates generally an example of a memory system that includes a host device coupled to a packaged memory device.

FIG. 2 illustrates generally an example of a first memory system 200 that includes a host device 202 coupled to a packaged memory device 204 using a front end interface 206. In an example, the first memory system 200 comprises a portion of the memory device 100, and the packaged memory device 204 includes a memory die stack 210 comprising multiple memory dies 208.

In the example of FIG. 2, the host device 202, such as can include the memory controller 108 or a CPU in a host device, can transmit commands and/or data to the packaged memory device 204 using the front end interface 206 (e.g., comprising the inter-device bus 110 or the second bus 112 from the example of FIG. 1). In this example, the front end interface 206 operates as a command and/or data input output pathway (e.g., a bus or a signal path or another group of signal paths). Further, as illustrated in FIG. 2, each memory die 208 can be stacked to form a memory die stack 210 (e.g., a 3D memory stack) so that multiple memory dies 208 comprise the packaged memory device 204 and the packaged memory device 204 has a minimized or reduced package footprint relative to non-stacked devices.

Figure 3:
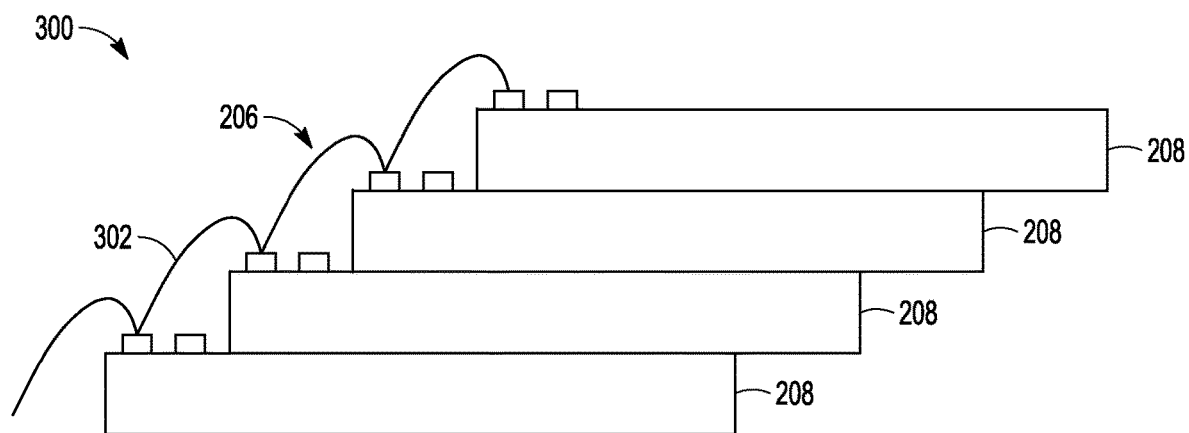
FIG. 3 illustrates generally an example of a memory die stack.

FIG. 3 illustrates generally an example of a memory die stack 300 that includes multiple coupled instances of the memory die 208. In an example, the memory die stack 300 comprises an example of the memory die stack 210 from FIG. 2.

In the example of FIG. 3, the front end interface 206 is coupled to each of the illustrated memory dies 208. One or more connections, such as including bond wires 302, through silicon vias (TSVs), or the like, can be used to extend the front end interface 206 to each of the memory dies 208. As illustrated, this forms a cascade or daisy chain connection. Alternatively, one or more direct connections for each segment of the bond wire 302 can be coupled to a common substrate, rather than to an adjacent one of the memory dies 208. Likewise, a combination of these two wiring techniques can be used to connect each of the memory dies 208 of the memory die stack 300 to the front end interface 206.

In the example of FIG. 2 and FIG. 3, input command/address, control, or other data pins or busses of the memory device can be shared across the different memory dies 208 that comprise the memory die stack 300. However, due at least in part to capacitive loading, this configuration exhibits reduced net interface speeds of the first memory system 200. The loading and corresponding reduction in net speed can be a function of a height of the memory die stack 300. In other words, as the number of the memory dies 208 in the memory die stack 300 increases, the loading effects on each channel of the front end interface 206 can detrimentally affect interface speed. Furthermore, each memory die 208 in the memory die stack 300 can be configured to function as a primary die and, in turn, can consume more power or other system resources.

Figure 4:
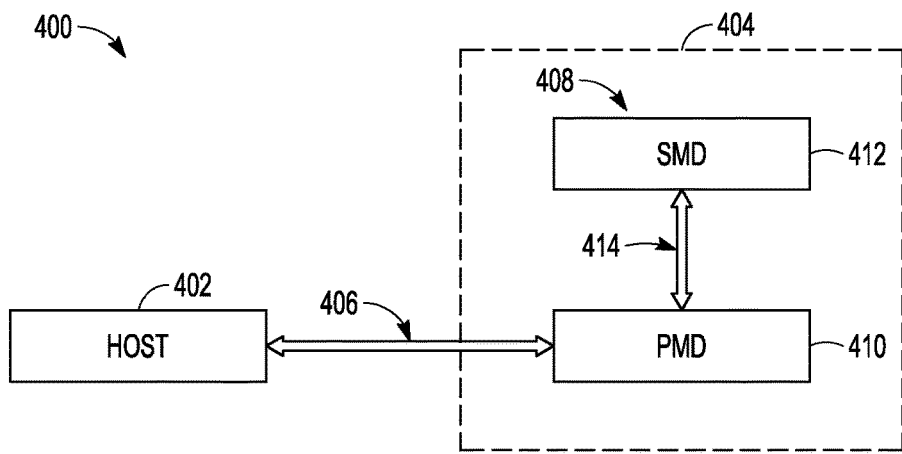
FIG. 4 illustrates generally an example of a memory system that includes a host device coupled to a packaged memory device.

FIG. 4 illustrates generally an example of a second memory system 400 that includes a host device 402 coupled to a packaged memory device 404 using a host interface bus 406. In an example, the second memory system 400 comprises a portion of the memory device 100, and the packaged memory device 404 includes a memory die stack 408 comprising multiple memory dies, including a primary die 410 and at least one secondary die 412.

In the example of FIG. 4, the host device 402 (e.g., the memory controller 108 or a CPU in the host device) transmits commands and/or data to the primary die 410 of the packaged memory device 404 using the host interface bus 406 (e.g., comprising the inter-device bus 110 or the second bus 112 from the example of FIG. 1).

The packaged memory device 404 can include the memory die stack 408, and the memory die stack 408 can include a primary die 410 (e.g., similar to the memory die 208 from the example of FIG. 2) and one or more secondary dies, such as the secondary die 412, such as can be physically disposed on or stacked on the primary die 410. The primary die 410 can be coupled to the secondary die 412, and to one or more other secondary dies 412 in the packaged memory device 404, using an intra-package bus 414, sometimes referred to as a back-end interface and optionally including one or multiple signal paths. In an example, the intra-package bus 414 can be decoupled from the host interface bus 406. In some examples, one or more signal paths can be provided in common or shared between the host interface bus 406 and the intra-package bus 414.

In an example, the host interface bus 406 and/or the intra-package bus 414 can comprise multiple parallel data paths that can be directional or bidirectional. For example, the intra-package bus 414 can include a first data path (e.g., comprising multiple parallel bit channels) designated for communications from the primary die 410 to the secondary dies 412, and a second data path (e.g., comprising multiple parallel bit channels) designated for communications from some or all of the secondary dies 412 to the primary die 410. In an example, usage of or access to the second data path portion of the intra-package bus 414 can be specified by the primary die 410 in a time-multiplexed manner to avoid data collisions. The same or similar configuration can be used for the host interface bus 406 such as to facilitate communication between one or more primary dies 410 and one or more host devices 402.

Figure 5:
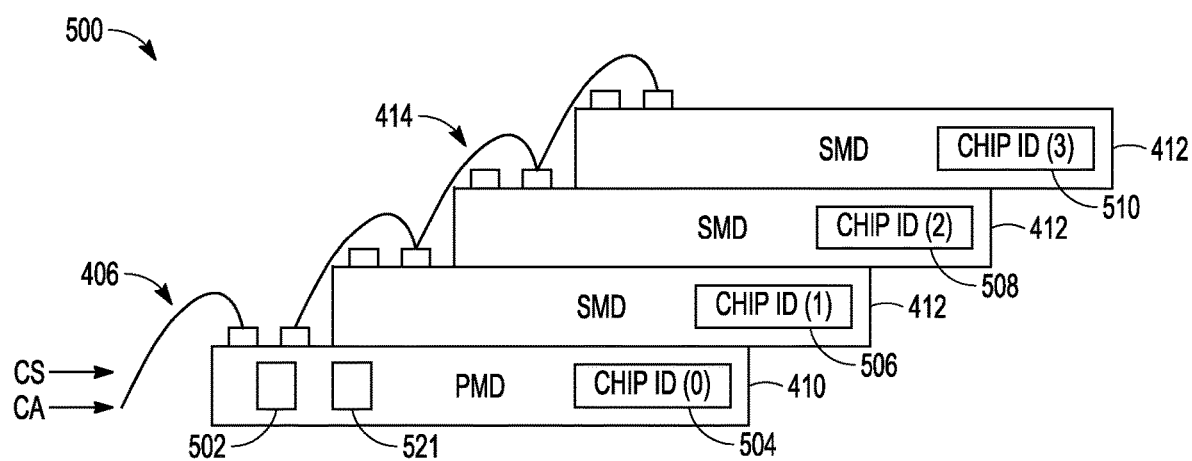
FIG. 5 illustrates generally an example of a memory die stack.

FIG. 5 illustrates generally an example of a memory die stack 500 that includes the primary die 410 and multiple secondary dies 412, or multiple different instances of the secondary die 412. In an example, the memory die stack 500 comprises an example of the memory die stack 408 from FIG. 4. While the illustrated example of the memory die stack 500 includes one of the primary die 410 and three of the secondary dies 412 stacked thereon, fewer or additional secondary dies 412 can be used, or the primary die 410 can be provided in a location in the stack other than the bottom. In some examples, the primary die 410 and one or more of the secondary dies 412 can comprise a portion of the same or different silicon.

In the example of FIG. 5, the primary die 410 is directly coupled to the host interface bus 406 using, for example, bond wires (or other connection paths). The secondary dies 412 can be coupled to the primary die 410 using bond wires or through-silicon vias (or other connection paths) that comprise the intra-package bus 414. In an example, each secondary die 412 can be coupled only to primary die 410 and not directly coupled to the host interface bus 406. In other words, the secondary dies 412 can be coupled to the host interface bus 406 exclusively via the primary die 410, and the primary die 410 can coordinate any inter-package communications from the secondary dies 412.

In an example, a first bond wire (or other connection path) that comprises the intra-package bus 414 can be directly coupled from the primary die 410 to a first one of the stacked secondary dies 412, and a second bond wire can be directly coupled from the first one of the stacked secondary dies 412 to a second one of the stacked secondary dies 412, and so on. In other words, the secondary dies 412 can be daisy chained together and to the primary die 410. In this manner, each secondary memory die can receive signals (e.g., clock, command, control, and/or address and/or data signals) from the primary die 410 directly, and from the host device 402 indirectly, because any direct communication between the packaged memory device 404 and the host device 402 can be performed (e.g., exclusively performed) by the primary die 410. That is, each of the secondary dies 412 can be decoupled from the host interface bus 406 but each can be directly coupled to the intra-package bus 414.

When the host device 402 is directly coupled only with the primary die 410 of the packaged memory device 404, path loading or capacitance due to the presence of multiple other dies can be minimized. In other words, by isolating the secondary dies 412 from the host interface bus 406, capacitive loading effects of the secondary die 412 can be removed from the host interface bus 406. Accordingly, the host interface bus 406 can be configured to use relatively greater clock speeds or signal rates (e.g., data rates) along the front end interface path, such as relative to the examples of the packaged memory device 204 from FIG. 2 and FIG. 3.

In an example, any one or more of the dies in the packaged memory device 404 can include or use a trim circuit 502. The trim circuit 502 can include, for example, a string of delay elements (e.g., inverters, logic gates, combinatorial logic circuits, and the like) from which a desired number of delay elements or a total amount of signal delay can be selected and applied to a signal to delay that signal transmitted along the intra-package bus 414. In an example, the trim circuit 502 can include one or more clock delay circuits, such as a timing delay generator, combinatorial logic circuits, and/or similar circuitry that can be tuned to provide a particular amount of clock delay, or clock division, associated with transmission of the signals using the intra-package bus 414. Likewise, the trim circuit 502 can include circuit elements of both delay techniques described above to delay the signal and adjust a clock signal. Using the trim circuit 502, de-skewing of the delays of individual memory dies (e.g., of one or more of the primary die 410 or any one or more of the secondary dies 412) can be used to generate an overall constant delay, thereby ensuring that the dies in the packaged memory device 404 have the same net timing delay.

In an example, the trim circuit 502 comprises a self-tuning circuit that includes, for example, a field configurable gate array (FPGA), an application specific integrated circuit (ASIC), a configurable processor (e.g., a microprocessor), or other element for performing a special purpose function alone (e.g., via hardware, such as circuitry) or by executing code tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like and/or may be located in the self-tuning circuit or in a portion of the primary die 410 in which the self-tuning circuit is disposed.

In operation, the self-tuning circuit can measure the delays to the secondary dies 412 (e.g., of signals originating at the primary die 410), determine a worst-case delay characteristic, and program (e.g., initialize, configure, or otherwise set up) each trim circuit in one or more of the dies of the packaged memory device 404 so that secondary dies 412 have a consistent (e.g., the same) total delay by generating respective fixed delays caused by the respective trim circuits. This process can similarly be applied to the primary die 410. The tuning process can optionally be performed during device manufacturing or can be performed upon device initialization or later. This flexibility in the tuning process may be beneficial in situations where, for example, the memory device can be operated at multiple different speeds (i.e., having differing data rates and/or clock frequencies). Thus, the self-tuning circuit can be used to trim the various memory dies in view of the particular operating characteristics (e.g., clock frequencies) of the memory device 100.

In the example of FIG. 5, each die in the memory die stack 500 can have a respective different chip ID that uniquely identifies or distinguishes the die from the others in the same stack, or in the system in which the stack is used. For example, the primary die 410 can have a corresponding first chip ID (0) 504, a first one of the secondary dies 412 can have a second chip ID (1) 506, a second one of the secondary dies 412 can have a third chip ID (2) 508, and a third one of the secondary die 412 can have a fourth chip ID (3) 510. In this example, each of the chip IDs can be different, and can include a multiple-bit identification field. In an example, the protocol, size, or format of the chip ID of the primary die 410 can be the same as, or different from, the chip ID of the secondary dies 412.

In an example, each chip ID can be assigned to a corresponding die at a time of manufacture, at device initialization, or at another time. In other words, the chip ID for a particular die can be a static identifier or the chip ID can be dynamically updated or changed. Each package, such as the packaged memory device 404 that includes the memory die stack 500, can thus support multiple different chip IDs.

In operation, a particular packaged device or a particular die in a stack can be separately addressed using a command packet that includes or uses a chip ID field. For example, each of multiple stacks can include a respective primary die with a corresponding primary chip ID. The host interface bus 406 can exchange messages between the host device 402 and the various primary dies (or stacks) using messages that include or use at least one primary chip ID to designate a particular one of the multiple stacks. Similarly, the intra-package bus 414 can exchange messages between a particular primary die and one or more secondary dies using messages that include or use at least one secondary chip ID to designate a particular one of the secondary dies in the same stack. For example, the primary die 410 can use the intra-package bus 414 to send a message or command to the first secondary die 412 using a message that includes, e.g., a chip ID (1) 506. Since the intra-package bus 414 couples the primary die 410 to each of the secondary dies 412, each individual one of the secondary dies 412 can determine whether to receive or respond to messages from the primary die 410 based on the chip ID field of each message or command transmitted on the intra-package bus 414.

In an example, the host interface bus 406 can include multiple parallel paths or channels including a chip select (CS) path and a command/address (CA) path. The primary die 410 can receive information from the host device 402 on the CS and CA paths and, if needed, can send commands to one or more of the secondary dies 412 in the memory die stack 500, such as to fulfill a read or write request from the host device 402. In an example, the commands for the memory die stack 500 can be received directly at the primary die 410 using package solder bumps or balls that couple the memory die stack 500 to the memory or host system.

The intra-package bus 414 can comprise package-internal command/address paths, a chip select path, a clock signal path, or other path(s), that can extend from the primary die 410 to the secondary dies 412. In an example, the intra-package bus 414 comprises bond wires, through-silicon vias, or other means for physically coupling the dies in the package.

The primary die 410 and the secondary dies 412 can operate at the same clock speed or at different clock speeds. In an example, the primary die 410 can include a clock signal divider circuit 512. The clock signal divider circuit 512 can be configured to receive a clock signal from the host device 402 via the host interface bus 406. The clock signal divider circuit 512 can be configured to generate a reduced clock signal, based on the received clock signal from the host device 402, and can provide the reduced clock signal to the secondary dies 412 using the intra-package bus 414.

In an example, the reduced clock signal can be a multiple of or fraction of the clock signal received from the host device 402. Accordingly, the secondary dies 412 can be configured to operate at a data speed that is less than a data speed used between the host device 402 and the primary die 410. In an example, the data speed of the intra-package bus 414 can be about half the speed of the host interface bus 406, which can help save power and preserve the integrity of package-internal signals. Furthermore, the primary die 410 can be configured to coordinate memory operations using multiple ones of the secondary dies 412 in parallel to maximize efficiency and throughput on the host interface bus 406. In other words, the primary die 410 can be configured to coordinate concurrent and independent operations of multiple secondary dies 412 using the intra-package bus 414 operating at a first clock speed, for example, to accommodate commands from the host device 402 that are received using the host interface bus 406 operating a greater second clock speed.

In an example that includes a read command from the primary die 410 to a particular one of the secondary dies 412, the particular one of the secondary dies 412 can broadcast a response on the shared intra-package bus 414. In an example, the response message can include a chip ID field, optionally identifying the source of the response message (e.g., as the particular one of the secondary dies 412) or identifying the destination for the response message, such as the primary die 410. In an example, the primary die 410 can coordinate response times of the multiple secondary dies 412, or can designate response windows, such that the chip ID field can be omitted from response messages that are intended for receipt by the primary die 410.

In an example that includes a write command from the primary die 410 to a particular one of the secondary dies 412, the primary die 410 can broadcast the command together with a chip ID using the intra-package bus 414. In an example, the primary die 410 can provide the write command in response to a corresponding command from the host devices 402, which command may or may not include the chip ID of the particular one of the secondary dies 412 to fulfill the request. The write command from the primary die 410 can be received by each of the secondary dies 412, and each secondary die 412 can include a listening circuit that listens for its respective chip ID on the intra-package bus 414. When the particular one of the secondary dies 412 receives the write command with its corresponding chip ID, then the die can receive and process the command, for example, using the listening circuit to coordinate initialization or other operations of the particular die. Any one or more of the secondary dies 412 that is not actively engaged by the primary die 410 can optionally dwell in a standby mode or low-power mode.

A memory command packet can optionally include a multiple-clock cycle chip ID field in messages that are communicated by or between the primary die 410 and one or more of the secondary dies 412. Using a protocol that includes a chip ID field enables each die in a package to independently determine when and whether to expend processing resources to fulfill a particular request or execute a particular command issued on a shared bus, such as the intra-package bus 414.

Figure 6:
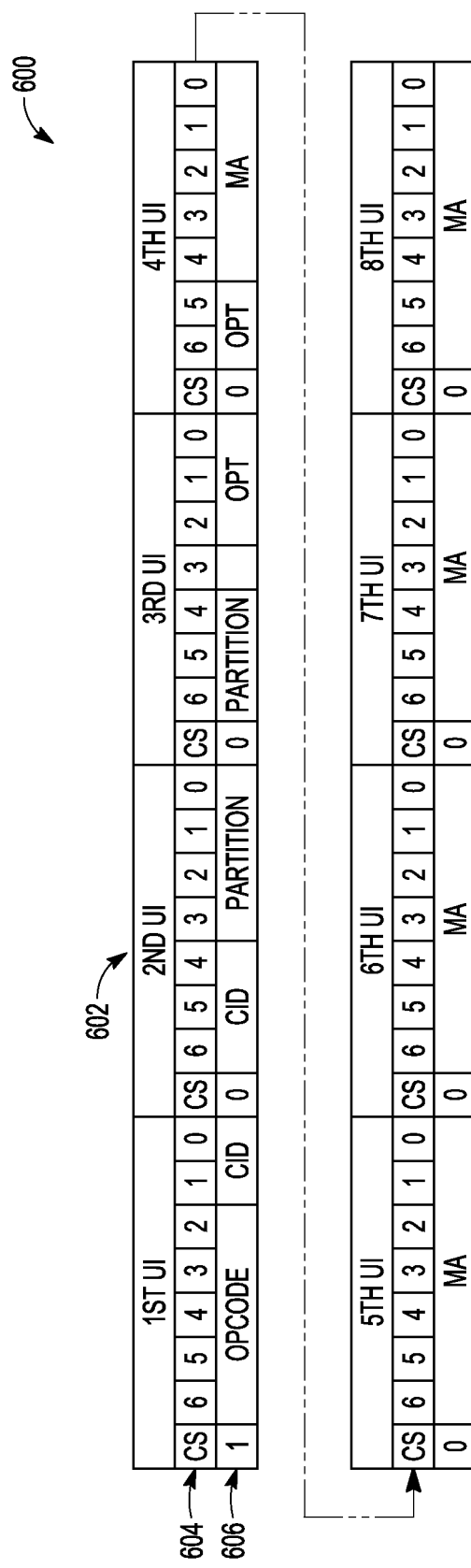
FIG. 6 illustrates generally an example of a command protocol diagram for memory die communications.

FIG. 6 illustrates generally an example of a command protocol diagram 600 that can be used to communicate commands or other information with or by a primary die 410. In an example, commands received by the primary die 410 from the host device 402 can use the conventions illustrated in the command protocol diagram 600. In an example, commands issued by the primary die 410 to one of the secondary dies 412 in the memory die stack 500 can use the conventions illustrated in the command protocol diagram 600. In an example, any one or more of the secondary dies 412 can use the conventions illustrated in the command protocol diagram 600 in communications with the primary die 410.

The command protocol diagram 600 includes an opcode-based command structure. The opcode-based command structure can include one or more operation codes, instruction codes, opstrings, or other indicators that comprise a machine instruction for a particular operation. In an example, the command protocol diagram 600 includes a particular opcode to specify an operation and further includes one or more operands, such as can include register values, addresses, or other information.

The command protocol diagram 600 shows a command that comprises multiple unit intervals (UI), and each UI can correspond to a clock cycle for processing multiple bits. In the example of FIG. 6, the command protocol diagram 600 shows a first message 602 that includes eight UIs (e.g., corresponding to eight clock cycles), and each UI can correspond to eight message bits. The message bits 604 are illustrated in the example of the first message 602 with bits 0 through 6, and a CS bit, for each UI. Contents or functions of the message bits 604 for the example of the first message 602 is indicated by the bit descriptions 606. For example, a first message bit of the message bits 604 for each UI can correspond to a chip select (CS) pin or line on the host interface bus 406 or intra-package bus 414. In the example of the first message 602, a CS value of "1" indicates a first UI to the controller, and a CS value of "0" indicates inactivity for the particular device after, e.g., the eighth UI elapses.

In the example of the first message 602 of FIG. 6, the first UI can include, and can lead with, an opcode field (OP-CODE). The opcode field can include a multiple-bit (e.g., 5 bit) instruction designating a particular operation for the target device (e.g., read, write, etc.). The first message 602 can include a chip ID field (CID) following the opcode field. The chip ID field can include a multiple-bit message that addresses a particular die. For example, the chip ID can include information about a chip ID or address of one or more of the primary die 410 or the secondary dies 412 in the memory die stack 500.

In an example, a UI in the first message 602 can further include a partition field (PARTITION) that can include partition information that specifies a particular memory partition, or memory bank, or cell array, etc., on the die corresponding to the particular chip ID. The first message 602 can further include an option field (OPT) that can include one or more options or attributes for the target device to use in performing or responding to the command in the first message 602. In an example, the first message 602 can further include various additional operands (MA) that can include memory addresses, data, or other information.

Using the conventions indicated in the command protocol diagram 600, commands on the host interface bus 406 or on the intra-package bus 414 can include or use a single packet (e.g., an eight byte, or eight UI, packet) to execute any memory command. In some prior solutions, designated physical pins or paths can be used to address different dies. That prior approach can be expensive and can use a large physical footprint. In contrast, the present solution can use a common bus, such as the intra-package bus 414, to carry messages between multiple dies and each die can independently determine when or whether to respond based on information in the chip ID field of a command. In other prior solutions, an identifier can be used as a separate command, and each die on a common bus can be configured to maintain a memory of the current identifier. In this scenario, bus efficiency losses can be significant, for example, while unused die wait for a turn to access the shared bus. In contrast, the present solution can integrate the chip ID field in commands using a shared bus. This technique can help maximize bus efficiency because a sequence of commands can be issued to respective different devices, for example, without issuing separate device identification commands and without occupying the shared bus between commands.

In an example, command messages structured according to the command protocol diagram 600 can be received at the primary die 410 using the host interface bus 406. The primary die 410 can be configured to modify or adjust one or more aspects of the received command messages and provide corresponding intra-package command(s) to one or more of the secondary dies 412 using the intra-package bus 414. The intra-package command(s) can follow the same conventions established by the command protocol diagram 600 or can follow other conventions, such as to meet timing, signal integrity, performance, or other requirements of the secondary dies 412 or the intra-package bus 414.

The command protocol diagram 600 in FIG. 6 represents one example of information that can include or comprise a communication protocol for inter-package or intra-package communication using the host interface bus 406, the intra-package bus 414, or other path or bus. Other configurations that comprise a chip ID field, an opcode, and one or more operands can similarly be used.

Figure 7:
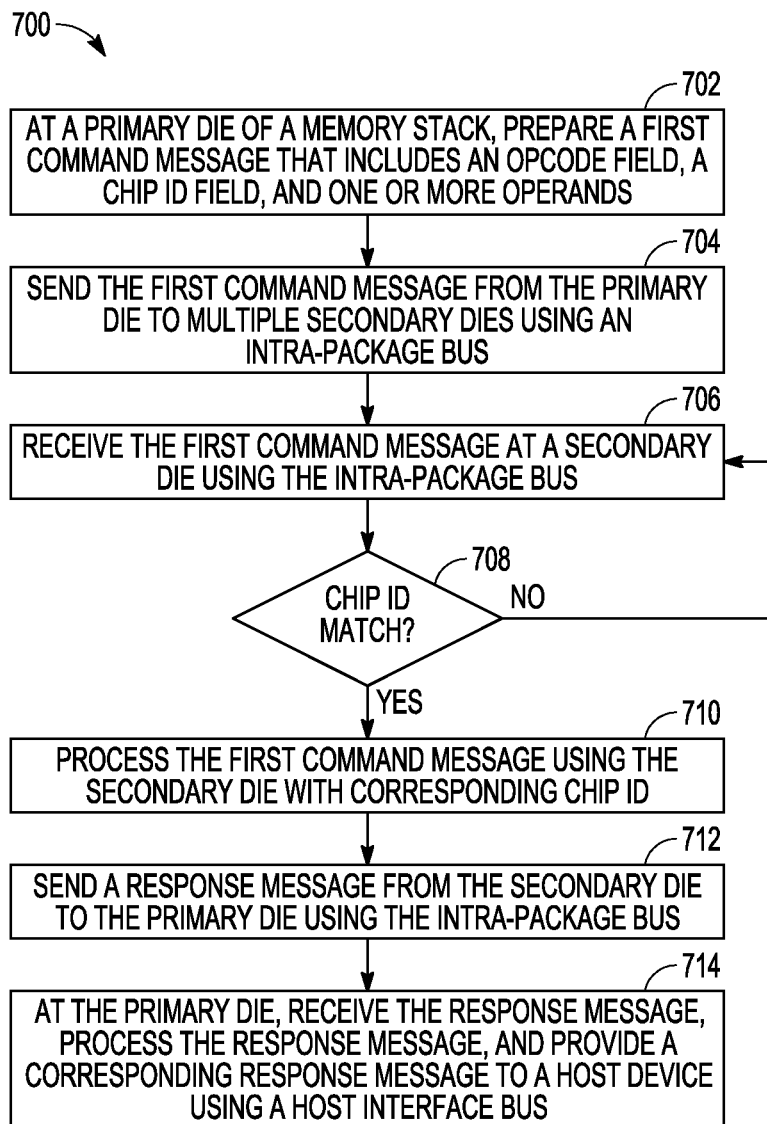
FIG. 7 illustrates generally an example of a communication routine for a memory die stack.

FIG. 7 illustrates generally an example of a communication routine 700 that can include or use the memory die stack 500 to communicate information among its dies using messages that conform generally to the command protocol diagram 600. At block 702, the communication routine 700 can include preparing a first command message, according to the command protocol diagram 600, at a primary die of a memory die stack. Block 702 can include, for example, using the primary die 410 to respond to a read or write request from the host device 402. In an example, block 702 includes using the primary die 410 to prepare the first command message with message fields that include at least an opcode field (e.g., to define the operation to be performed at the destination die), a chip ID field uniquely corresponding to the destination die, and optionally one or more operands.

At block 704, the communication routine 700 can include sending the first command message from the primary die 410 using the intra-package bus 414. In the example of FIG. 7, multiple secondary dies 412 can be coupled to the intra-package bus 414, and each of the secondary dies 412 can include or use a designated different chip ID. At least one of the chip IDs of the secondary dies 412 can correspond to the information in the chip ID field prepared at block 702. However, each of the multiple secondary dies 412 can receive the same first command message from the primary die 410.

At block 706, the communication routine 700 can include receiving the first command message at each of multiple different ones of the secondary dies 412 via the intra-package bus 414. At decision block 708, each of the receiving secondary dies 412 can evaluate the first command message to determine whether its respective identifier corresponds to the information in the chip ID field of the message. For example, if the chip ID field comprises information corresponding to the chip ID (2) 508 of a second secondary die, then a first secondary die having chip ID (1) 506 can ignore the first command message. The communication routine 700 can then continue, for example concurrently or in parallel, using each of the secondary dies 412 to determine whether to respond to, or perform operations indicated by, the first command message based on the information in the chip ID field.

In an example, the second secondary die, such as having the chip ID (2) 508, can recognize its own chip ID in the first command message and can therefore continue at block 710 with processing the first command message. For example, the second secondary die can respond to or carry out a read or write operation specified by the first command message while other secondary dies, coupled to the same intra-package bus 414, can ignore the first command message.

In this example, at block 712, the second secondary die that has the chip ID (2) 508 can prepare and send a response message to the primary die 410. In an example, block 712 can include using the same intra-package bus 414 to send the response message from the responding secondary die to the primary die 410. In an example, data collisions can be avoided by timing the response message according to instructions from the primary die 410.

At block 714, the communication routine 700 can include receiving the response message at the primary die 410 via the intra-package bus 414. In an example, the primary die 410 can prepare a corresponding further response message to the host device 402, such as based on the response message from the secondary die 412. The primary die 410 can communicate its further response message to the host device 402 using the host interface bus 406.

In an example, the stacked memory devices discussed herein can be configured for package-level or die-level power conservation. For example, each individual die in a stack can be separately placed in a low-power or standby mode, and each die in the stack can be individually woken-up and placed in a higher-power active mode. In an example, standby entry and standby exit can be performed asynchronously or on-the-fly. Each die can include a listening circuit or wake-up circuit that monitors the intra-package bus 414 for a standby command, such as can include either a standby exit or standby entry command, for example, together with a chip ID field that indicates a standby instruction for a particular die.

In one solution, all activity on a shared bus, such as the command/address bus configured to communicate the message bits 604, can be arrested to ensure no die is active. When the command/address bus is quiet, then the command/address bus can be used to carry a standby entry or standby exit command to a target die. Following receipt of a standby exit command and after a wake time or wakeup procedure at the target die, the target die can carry out subsequent operations, such as can be defined by commands on the shared command/address bus. This solution may not enable on-the-fly standby entry or standby exit, and can be a non-synchronous technique that consumes several clock cycles with, e.g., WAKE and CS signal toggling sequences.

In an example, another solution includes or uses a standby command protocol for the memory die stack 500 that can include a standby entry or standby exit command that is inserted in or used with other command messages on the shared command/address bus. The protocol can include a multiple-bit command that can be provided to initiate a standby entry or standby exit procedure and can be synchronously interspersed with other commands on the same communication bus. In an example, the protocol can include or use a designated standby exit path in the communication bus.

In an example, standby entry and standby exit can comprise opcode-based operations or commands that can follow some or all of the conventions established in the command protocol diagram 600 of FIG. 6. For example, a command format can include:
   STBYENTRY [CHIP ID] [OPTIONS]
where STBYENTRY is an opcode that indicates a standby entry command. The command format can include:
   STBYEXIT [CHIP ID] [OPTIONS]
where STBYEXIT is an opcode that indicates a standby exit command. Each command can include a chip ID to designate a particular primary die or secondary die in a stack for standby entry or exit, and can further include one or more other options.

In an example, the host device 402 can be configured to broadcast a standby command using the host interface bus 406 to one or more device stacks, such as including the packaged memory device 404. In an example, the primary die 410 of the packaged memory device 404 can receive and optionally act on the standby command. In an example, the primary die 410 can be configured as a conduit for the standby command and can pass the standby command with or without alteration to one or more of the secondary dies 412. In this example, each of the primary die 410 and the secondary dies 412 can receive the standby command and, if a particular one of the dies has a chip ID that corresponds to a chip ID in the standby command, then the particular die can execute the standby command, such as can include a standby entry or standby exit command.

In an example, a primary die in a stack, such as the primary die 410, can be configured to broadcast a standby command internally to a package, such as using the intra-package bus 414. Each of the secondary dies 412 on the intra-package bus 414 can receive the standby command and, if a particular one of the secondary dies 412 has a chip ID that corresponds to a chip ID in the standby command, then the particular secondary die 412 can execute the standby command, such as can include a standby entry or standby exit command.

In an example, a primary die can receive a stack standby command from a host device, such as using the host interface bus 406. The stack standby command can follow the same or similar protocol as can be used for die-level standby commands. For example, the stack standby command can include or use a chip ID corresponding to the primary die 410. The stack standby command can operate fully in the synchronous domain of the memory system that includes the primary die 410.

In an example, if the chip ID field of a stack standby entry command corresponds to the chip ID of the primary die 410 (e.g., chip ID (0) 504), then the primary die 410 can command each of its corresponding secondary dies 412 into a standby mode. The command for each of the secondary dies 412 in the package can include a global command or can include respective standby entry commands for each secondary die using their respective chip IDs. Following issuance of the secondary die standby commands, the primary die 410 can itself enter a standby mode. In some examples, each secondary die 412 can include memory about whether it was designated for standby mode with an explicit standby entry command or with a global standby command. If, for example, an explicit standby entry command was issued to a particular secondary die, then the particular secondary die can be configured to ignore a subsequent global standby exit command and instead wait for a die-specific standby exit command.

In an example, if the chip ID field of a stack standby exit command corresponds to the chip ID of the primary die 410 (e.g., chip ID (0) 504), then the primary die 410 can initiate exit for itself and, optionally, for one or more of the secondary dies 412 in the same package. In an example, the primary die 410 can broadcast a global standby exit command using the intra-package bus 414 or the primary die 410 can command one or multiple particular secondary dies out of standby using the corresponding chip IDs for the particular secondary die(s). If a secondary die does not have a chip ID, or has not yet been assigned a chip ID by the primary die or by the host, then any such secondary die can respond to an initial standby exit command from the primary die 410, for example, without regard for the presence or content of the chip ID field in the command. In other words, any such secondary die without a chip ID can exit its standby mode immediately upon receipt of any standby exit command.

Figure 8:
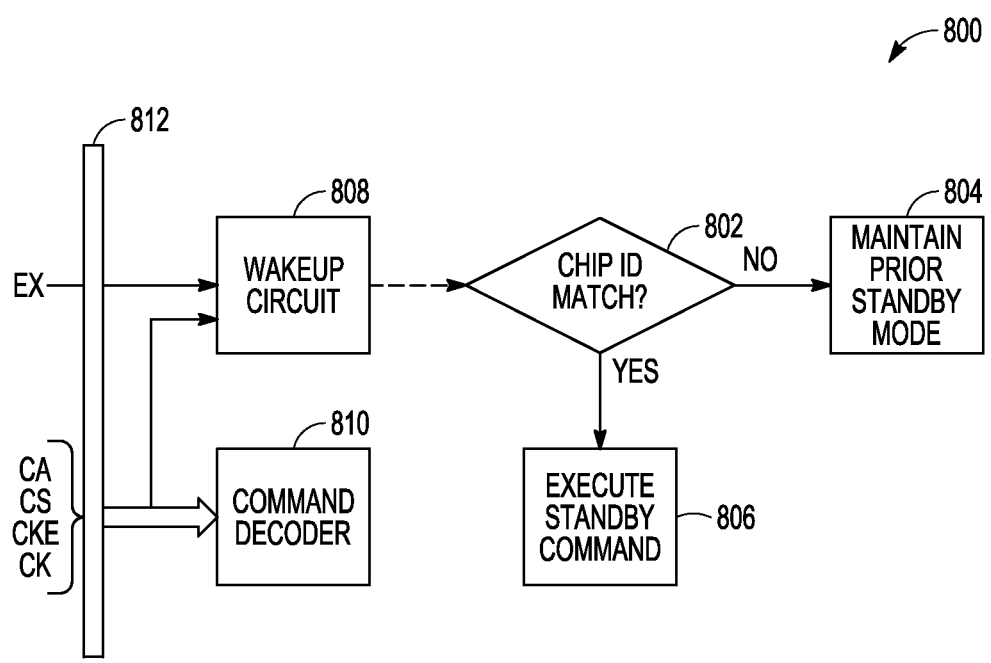
FIG. 8 illustrates generally a memory die schematic that can include a secondary die coupled to an intra-package bus.

FIG. 8 illustrates generally an example of a memory die schematic 800 that can include a particular die, such as the primary die 410 or a particular one of the secondary dies 412, coupled to a bus 812, such as the host interface bus 406 or the intra-package bus 414. In the example of FIG. 8, the die can include a wakeup circuit 808 and a command decoder 810, each of which can be coupled to the bus 812. The bus 812 can include lines or paths for, among other things, a command/address (CA) signal (e.g., comprising the message bits 604), a chip select (CS) signal, a clock (CK) signal, a clock enable (CKE) signal, and a standby exit (EX) signal. In an example, the EX signal line or path can comprise a portion of the bus 812 and can be shared among dies in a stack. In other examples, the EX signal path can comprise a separate bus between a host and a primary die, or between a primary die and a particular secondary die.

The command decoder 810 can comprise a processor configured to monitor information on the bus 812 for commands that include or use a particular chip ID corresponding to the particular die. The command decoder 810 can selectively respond to or execute commands (e.g., memory commands, such as read/write commands) received via the bus 812 when the command includes or uses the particular chip ID. In an example, the command decoder 810 can be active following a standby exit instruction from the wakeup circuit 808.

In an example, the wakeup circuit 808 comprises a circuit configured to selectively initiate standby entry or standby exit procedures for the particular die (e.g., including the primary die 410 or one of the secondary dies 412). The wakeup circuit 808 can include always-active logic or processor circuitry that stays in an awake or active state while other circuitry in the same die is powered down or idle. The wakeup circuit 808 can listen to, e.g., the CA signal and the EX signal for instructions to wake the die.

For example, the wakeup circuit 808 can receive the EX signal, and one or more other signals on the bus 812, to determine when or whether to execute standby entry or standby exit commands, such as to maintain or place the particular die in an active mode or a low-power mode. In an example, the wakeup circuit 808 can listen to information on the bus 812, including the EX signal, for a particular data sequence that indicates a standby exit or standby entry and further indicates a chip ID corresponding to the particular die.

The wakeup circuit 808 can perform operations to conditionally change a die operating mode based on information in a chip ID field of a received standby command. For example, at decision block 802, if the received message includes a data sequence that includes the chip ID for the particular die, then the particular die can execute the standby command at block 806. If, at decision block 802, the data sequence does not include the chip ID for the particular die, then the particular die can maintain a prior or current standby mode at block 804. That is, if the particular die is in an idle or standby mode, then it can maintain the standby mode, or if the particular die is in an active mode, then it can maintain the active mode.

Figure 9:
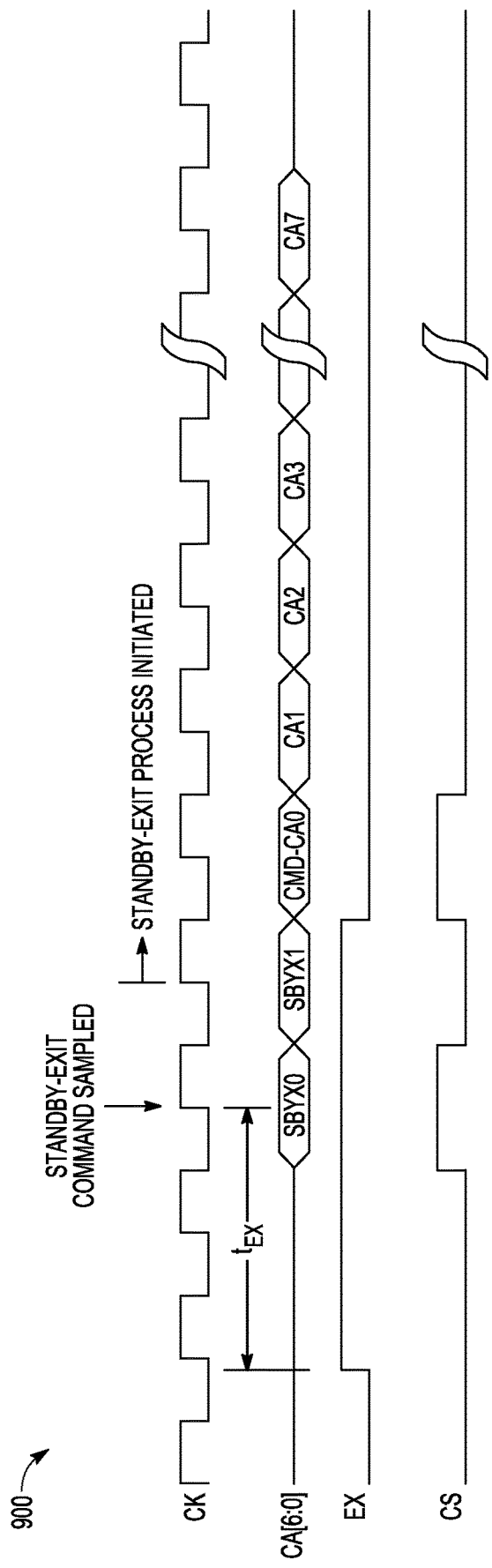
FIG. 9 illustrates generally an example of a first standby command timing diagram.

In an example, the data sequence can include a coordinated sequence with information from the EX signal and from one or more other signals on the bus 812. FIG. 9 illustrates generally an example of a first standby command timing diagram 900 that provides an example of a coordinated sequence for a standby command using the EX, CA, and CS signals from the bus 812.

In an example that includes a standby exit command, receiver circuitry such as the wakeup circuit 808 or the command decoder 810 on the particular die can be idle or in a standby mode. The wakeup circuit 808 can include a standby exit decode logic path that is enabled when the EX signal goes high or transitions. In an example, the EX signal can transition from low to high about $t_{EX}$ nanoseconds (e.g., about 2 ns) prior to sampling the CA signal for a standby command. In other words, when the wakeup circuit 808 receives the EX signal transition, it can configure itself or the command decoder 810 to sample the CA signal, such as after about $t_{EX}$ ns.

In the example of the first standby command timing diagram 900, the CA signal can be sampled from the CA line or bus by the command decoder 810 when the CS signal is high. If the chip ID field provided in the sampled command on the CA line matches the chip ID of the sampling die, and the sampled command includes a standby exit command, then the sampling die can initiate its standby exit procedure. If the chip ID field does not match the chip ID of the sampling die, then the receiver logic can remain on as long as the EX signal is high. In an example, if the EX signal is low when CS is high, then the information on the CA line can be ignored and the die can remain in a standby mode.

In an example, while a particular secondary die 412 wakes and executes its standby exit procedure, the CA line can be active with commands for other dies on the same bus 812, such as the host interface bus 406 or the intra-package bus 414. Accordingly, the bus 812 can remain useful and occupied carrying out other operations, optionally including other standby commands, while the particular secondary die 412 exits standby. In an example, while the particular secondary die 412 executes its standby exit procedure, it can ignore information on the CA line.

In the example of FIG. 9, standby exit commands for respective different secondary dies can be cascaded, or adjacent, on the CA line of the intra-package bus 414, such as with or without intervening blanking periods. For example, a first standby exit command (e.g., including command messages SBYX0 and SBYX1 in the first standby command timing diagram 900) for a first secondary die can occupy a first portion of the CA line on the intra-package bus 414. A subsequent command for a second secondary die can immediately follow the first standby exit command. For example, a command sequence of multiple unit intervals, such as CMD-CA0, and CA1, and so on, can immediately follow the SBYX1 portion of the first standby exit command to maximize efficiency and usage of the CA line. In other examples, standby entry commands or standby exit commands can be interspersed between other commands to active die sharing the same bus 812.

Figure 10:
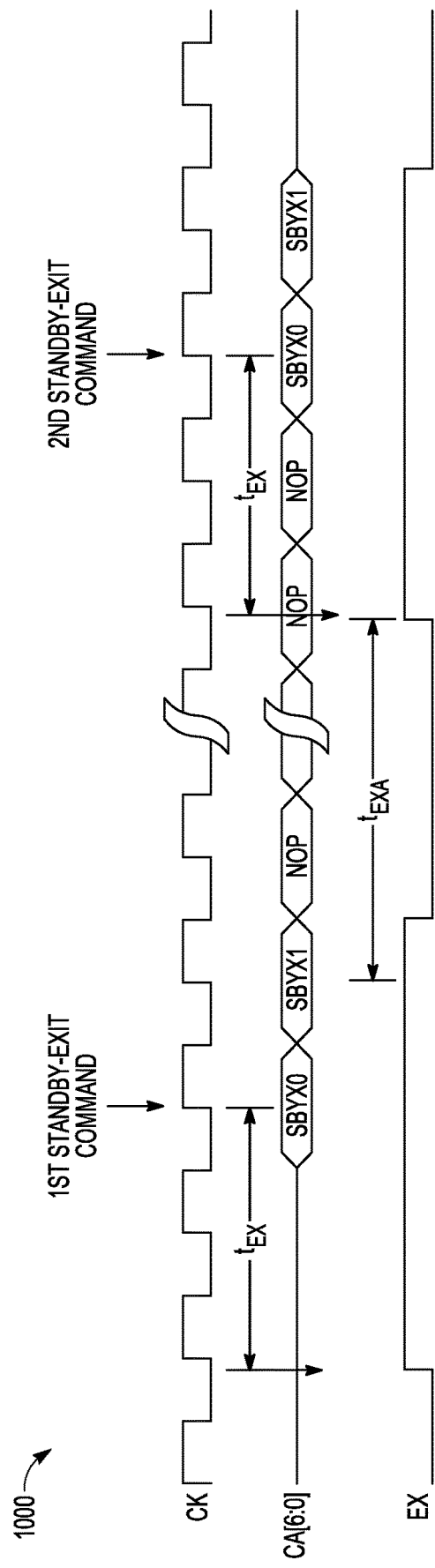
FIG. 10 illustrates generally an example of a second standby command timing diagram.

FIG. 10 illustrates generally an example of a second standby command timing diagram 1000. The second standby command timing diagram 1000 includes multiple standby commands, including non-adjacent standby commands on the CA line of the bus 812 for a particular die. For example, the second standby command timing diagram 1000 includes the first standby exit command (e.g., including command messages SBYX0 and SBYX1) for a first die (e.g., a first secondary die) as in the example of the first standby command timing diagram 900. The second standby command timing diagram 1000 can include a subsequent second standby exit command (e.g., including command messages SBYX0 and SBYX1) for another die (e.g., a second secondary die).

In the example of FIG. 10, a minimum blanking period, $t_{EX4}$, can be used to ensure any unused or unaddressed secondary dies on the same bus can return to its prior standby mode safely. If back-to-back standby exit commands (e.g., for respective different dies) are used, then the blanking period can be omitted (i.e., $t_{EX4}=0$). In an example, the minimum blanking period for non-adjacent standby exit commands can be about 5 ns.

Figure 11:
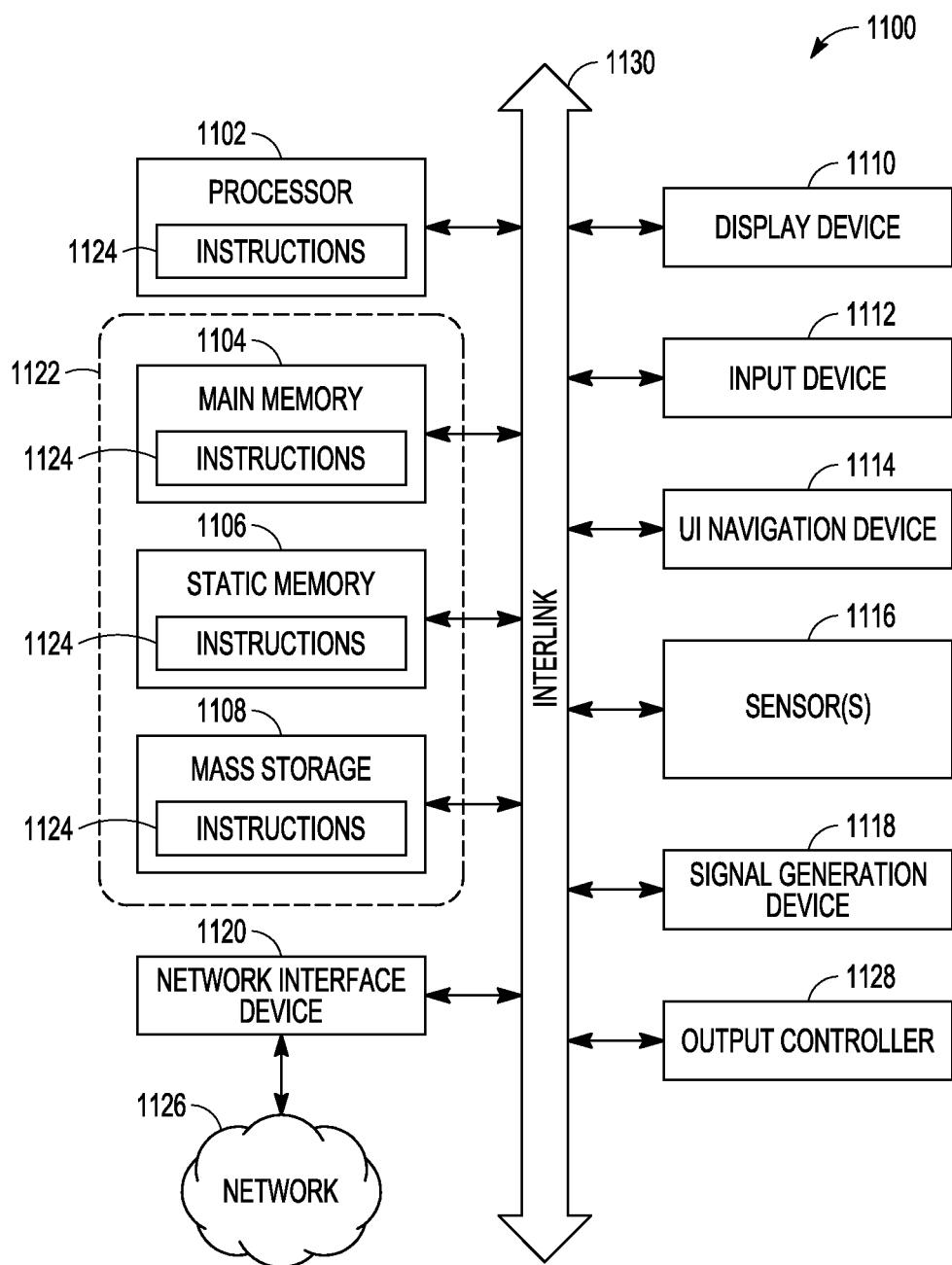
FIG. 11 illustrates a block diagram of an example machine with which, in which, or by which any one or more of the techniques discussed herein can be implemented.

FIG. 11 illustrates a block diagram of an example machine 1100 with which, in which, or by which any one or more of the techniques (e.g., methodologies) discussed herein can be implemented. Examples, as described herein, can include, or can operate by, logic or a number of components, or mechanisms in the machine 1100. Circuitry (e.g., processing circuitry) is a collection of circuits implemented in tangible entities of the machine 1100 that include hardware (e.g., simple circuits, gates, logic, etc.). Circuitry membership can be flexible over time. Circuitries include members that can, alone or in combination, perform specified operations when operating. In an example, hardware of the circuitry can be immutably designed to carry out a specific operation (e.g., hardwired) for example using the host interface bus 406 or intra-package bus 414. In an example, the hardware of the circuitry can include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine-readable medium elements are part of the circuitry or are communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

In alternative embodiments, the machine 1100 can operate as a standalone device or can be connected (e.g., networked) to other machines. In a networked deployment, the machine 1100 can operate in the capacity of a server machine, a client machine, or both in server-client network environments. In an example, the machine 1100 can act as a peer machine in peer-to-peer (P2P) (or other distributed) network environment. The machine 1100 can be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Any one or more of the components of the machine 1100 can include or use one or more instances of the second memory system 400 or the memory die stack 500. The machine 1100 (e.g., computer system) can include a hardware processor 1102 or host device (e.g., the host device 402, a central processing unit (CPU), a graphics processing unit (GPU), a hardware processor core, or any combination thereof), a main memory 1104, a static memory 1106 (e.g., memory or storage for firmware, microcode, a basic-input-output (BIOS), unified extensible firmware interface (UEFI), etc.), and mass storage device 1108 or memory die stack (e.g., the memory die stack 500, hard drives, tape drives, flash storage, or other block devices) some or all of which can communicate with each other via an interlink 1130 (e.g., bus). The machine 1100 can further include a display device 1110, an alphanumeric input device 1112 (e.g., a keyboard), and a user interface (UI) Navigation device 1114 (e.g., a mouse). In an example, the display device 1110, the input device 1112, and the UI navigation device 1114 can be a touch screen display. The machine 1100 can additionally include a mass storage device 1108 (e.g., a drive unit), a signal generation device 1118 (e.g., a speaker), a network interface device 1120, and one or more sensor(s) 1116, such as a global positioning system (GPS) sensor, compass, accelerometer, or other sensor. The machine 1100 can include an output controller 1128, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the hardware processor 1102, the main memory 1104, the static memory 1106, or the mass storage device 1108 can be, or include, a machine-readable media 1122 on which is stored one or more sets of data structures or instructions 1124 (e.g., software) embodying or used by any one or more of the techniques or functions described herein. The instructions 1124 can also reside, completely or at least partially, within any of registers of the hardware processor 1102, the main memory 1104, the static memory 1106, or the mass storage device 1108 during execution thereof by the machine 1100. In an example, one or any combination of the hardware processor 1102, the main memory 1104, the static memory 1106, or the mass storage device 1108 can constitute the machine-readable media 1122. While the machine-readable media 1122 is illustrated as a single medium, the term "machine-readable medium" can include a single medium or multiple media (e.g., a centralized or distributed database, or associated caches and servers) configured to store the one or more instructions 1124.

The term "machine readable medium" can include any medium that is capable of storing, encoding, or carrying instructions for execution by the machine 1100 and that cause the machine 1100 to perform any one or more of the techniques of the present disclosure, or that is capable of storing, encoding or carrying data structures used by or associated with such instructions. Non-limiting machine-readable medium examples can include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media can include: non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and CD-ROM and DVD-ROM disks.

In an example, information stored or otherwise provided on the machine-readable media 1122 can be representative of the instructions 1124, such as instructions 1124 themselves or a format from which the instructions 1124 can be derived. This format from which the instructions 1124 can be derived can include source code, encoded instructions (e.g., in compressed or encrypted form), packaged instructions (e.g., split into multiple packages), or the like. The information representative of the instructions 1124 in the machine-readable media 1122 can be processed by processing circuitry into the instructions to implement any of the operations discussed herein. For example, deriving the instructions 1124 from the information (e.g., processing by the processing circuitry) can include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 1124.

In an example, the derivation of the instructions 1124 can include assembly, compilation, or interpretation of the information (e.g., by the processing circuitry) to create the instructions 1124 from some intermediate or preprocessed format provided by the machine-readable media 1122. The information, when provided in multiple parts, can be combined, unpacked, and modified to create the instructions 1124. For example, the information can be in multiple compressed source code packages (or object code, or binary executable code, etc.) on one or several remote servers. The source code packages can be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 1124 can be further transmitted or received over a communications network 1126 using a transmission medium via the network interface device 1120 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), plain old telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1120 can include one or more physical jacks (e.g., Ethernet, coaxial, or phone jacks) or one or more antennas to connect to the network 1126. In an example, the network interface device 1120 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1100, and includes digital or analog communications signals or other intangible medium to facilitate communication of such software. A transmission medium is a machine readable medium.

To better illustrate the methods and apparatuses described herein, a non-limiting set of Example embodiments are set forth below as numerically identified Examples.

Example 1 is a memory system comprising a stack of memory dies including a primary die and two or more secondary dies, wherein the primary die is configured to communicate with an external host device and with the secondary dies. In Example 1, the primary die is configured to issue a command to the secondary dies using a first command message that includes an opcode field specifying a memory operation, a first chip identification field specifying a selected first die of the secondary dies, and one or more operands, wherein each of the secondary dies receives the same first command message.

In Example 2, the subject matter of Example 1 can include the primary die configured to issue the command in response to instructions received from the external host device using a memory interface bus.

In Example 3, the subject matter of Examples 1-2 can include an intra-package bus coupling the primary die and each of the secondary dies, and the primary die can be configured to send the first command message to the secondary dies using the intra-package bus.

In Example 4, the subject matter of Example 3 can include the external host device and a memory interface bus coupling the external host device and the primary die.

In Example 5, the subject matter of Example 4 can include the memory interface bus operating or configured to operate at a greater clock frequency than the intra-package bus.

In Example 6, the subject matter of Examples 1-5 can include the first command message comprising multiple unit intervals, wherein the opcode comprises a portion of a first unit interval of the first command message, the first chip identification field comprises a portion of the first unit interval and a portion of a second unit interval, and the one or more operands comprise one or more other unit intervals of the first command message.

In Example 7, the subject matter of Examples 1-6 can include each of the secondary dies configured to receive the first command message and determine whether to respond based on information in the first chip identification field.

In Example 8, the subject matter of Examples 1-7 can include the first die of the secondary dies configured to respond to the first command message, and the other one or more of the secondary dies configured to ignore the first command message.

In Example 9, the subject matter of Examples 1-8 can include the primary die configured to issue a subsequent command to the secondary dies using a second command message that includes a second chip identification field specifying a selected second die of the secondary dies.

In Example 10, the subject matter of Examples 1-9 can include the secondary dies stacked and the secondary die stack is disposed directly on or adjacent to the primary die.

In Example 11, the subject matter of Example 10 can include the secondary dies comprising chalcogenide-based memory cells.

Example 12 is a method comprising communicating instructions from a primary die to a first secondary die of multiple secondary dies in a memory stack that can include the primary die. In Example 12, communicating includes, at the primary die: preparing a first command message that includes an opcode field, a first chip identification field, and one or more operands, wherein the first chip identification field specifies the first secondary die, and broadcasting the first command message, using an intra-package bus, to the multiple secondary dies in the memory stack.

In Example 13, the subject matter of Example 12 can include the first command message including a series of unit intervals wherein the first chip identification field comprises bits in multiple different unit intervals.

In Example 14, the subject matter of Examples 12-13 can include receiving, via the intra-package bus, the first command message at each of the secondary dies in the memory stack, and at each of the secondary dies, determining whether information in the first chip identification field corresponds to an identification of the die.

In Example 15, the subject matter of Example 14 can include, at the first secondary die, preparing a response to the first command message, and at the secondary dies other than the first secondary die, ignoring the first command message.

In Example 16, the subject matter of Examples 12-15 can include providing an instruction from a host device to the primary die using a memory interface bus, wherein the memory interface bus is a different bus than the intra-package bus.

In Example 17, the subject matter of Example 16 can include the memory interface bus operating or configured to operate at a higher clock speed than the intra-package bus.

In Example 18, the subject matter of Examples 16-17 can include, at the primary die, providing a divided clock signal to the secondary dies, wherein the divided clock signal has a lower frequency than a frequency of the memory interface bus.

Example 19 is a packaged memory device comprising a primary memory die configured to receive instructions from an external host device using a host interface and, in response, broadcast commands to each of multiple different secondary dies using an intra-package interface, a first secondary memory die directly physically coupled to the primary memory die, wherein the first secondary memory die has a first chip identification, and a second secondary memory die directly physically coupled to the first secondary memory die, wherein the second secondary memory die has a second chip identification. In Example 19, the commands from the primary memory die uniquely address a selected one of the secondary memory dies using a message field that can include the first or second chip identification, respectively.

In Example 20, the subject matter of Example 19 can include the primary memory die configured to determine which of the secondary dies to use to fulfill the instructions from the external host device.

In Example 21, the subject matter of Examples 19-20 can include the external host device configured to communicate with the primary memory die without using a chip identification field corresponding to the first and second secondary memory dies.

In Example 22, the subject matter of Examples 19-21 can include the primary memory die configured to compose instruction messages that include an opcode field specifying a memory operation, a chip identification field specifying a particular secondary memory die in a common package with the primary memory die, and one or more operands.

In Example 23, the subject matter of Examples 19-22 can include the first secondary memory die configured to ignore commands from the primary memory die that include the second chip identification, and the second secondary memory die can be configured to ignore commands from the primary memory die that include the first chip identification.

In Example 24, the subject matter of Examples 19-23 can include the intra-package interface, and the primary memory die is configured to generate a reduced-frequency clock signal for the intra-package interface based on a clock signal of the host interface.

In Example 25, the subject matter of Examples 19-24 can include the secondary memory dies comprising chalcogenide-based memory cells.

Example 26 is at least one machine-readable medium including instructions that, when executed by processing circuitry, cause the processing circuitry to perform operations to implement any portion of any of Examples 1-25.

Example 27 is an apparatus comprising means to implement any portion of any of Examples 1-25.

Example 28 is a system to implement of any of Examples 1-25.

Example 29 is a method to implement of any of Examples 1-25.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A memory system comprising:
a stack of memory dies including a primary die and two or more secondary dies, wherein the primary die is configured to communicate with an external host device and with the secondary dies;
wherein the primary die is configured to issue a command to the secondary dies using a first command message that includes:
an opcode field specifying a memory operation;
a first chip identification field specifying a selected first die of the secondary dies; and
one or more operands;
wherein each of the secondary dies receives the same first command message.

2. The memory system of claim 1, wherein the primary die is configured to issue the command in response to instructions received from the external host device using a memory interface bus.

3. The memory system of claim 1, further comprising an intra-package bus coupling the primary die and each of the secondary dies, and wherein the primary die is configured to send the first command message to the secondary dies using the intra-package bus.

4. The memory system of claim 3, further comprising the external host device and a memory interface bus coupling the external host device and the primary die.

5. The memory system of claim 4, wherein the memory interface bus operates at a greater clock frequency than the intra-package bus.

6. The memory system of claim 1, wherein the first command message comprises multiple unit intervals, wherein the opcode comprises a portion of a first unit interval of the first command message, the first chip identification field comprises a portion of the first unit interval and a portion of a second unit interval, and the one or more operands comprise one or more other unit intervals of the first command message.

7. The memory system of claim 1, wherein each of the secondary dies is configured to receive the first command message and determine whether to respond based on information in the first chip identification field.

8. The memory system of claim 1, wherein the first die of the secondary dies is configured to respond to the first command message, and wherein the other one or more of the secondary dies is configured to ignore the first command message.

9. The memory system of claim 1, wherein the primary die is configured to issue a subsequent command to the secondary dies using a second command message that includes a second chip identification field specifying a selected second die of the secondary dies.

10. The memory system of claim 1, wherein the secondary dies are stacked and disposed directly on the primary die.

11. The memory system of claim 10, wherein the secondary dies include chalcogenide-based memory cells.

12. A method comprising:
communicating instructions from a primary die to a first secondary die of multiple secondary dies in a memory stack that includes the primary die, the communicating including, at the primary die:
preparing a first command message that includes an opcode field, a first chip identification field, and one or more operands, wherein the first chip identification field specifies the first secondary die; and
broadcasting the first command message, using an intra-package bus, to the multiple secondary dies in the memory stack.

13. The method of claim 12, wherein the first command message includes a series of unit intervals wherein the first chip identification field comprises bits in multiple different unit intervals.

14. The method of claim 12, further comprising:
receiving, via the intra-package bus, the first command message at each of the secondary dies in the memory stack; and
at each of the secondary dies, determining whether information in the first chip identification field corresponds to an identification of the die.

15. The method of claim 14, further comprising:
at the first secondary die, preparing a response to the first command message; and
at the secondary dies other than the first secondary die, ignoring the first command message.

16. The method of claim 12, further comprising providing an instruction from a host device to the primary die using a memory interface bus, wherein the memory interface bus is a different bus than the intra-package bus.

17. The method of claim 16, wherein the memory interface bus operates at a higher clock speed than the intra-package bus.

18. The method of claim 16, further comprising:
at the primary die, providing a divided clock signal to the secondary dies, wherein the divided clock signal has a lower frequency than a frequency of the memory interface bus.

19. A packaged memory device comprising:
a primary memory die configured to receive instructions from an external host device using a host interface and, in response, broadcast commands to each of multiple different secondary dies using an intra-package interface;
a first secondary memory die directly physically coupled to the primary memory die, wherein the first secondary memory die has a first chip identification; and
a second secondary memory die directly physically coupled to the first secondary memory die, wherein the second secondary memory die has a second chip identification;
wherein the commands from the primary memory die uniquely address a selected one of the secondary memory dies using a message field that includes the first or second chip identification, respectively.

20. The packaged memory device of claim 19, wherein the primary memory die is configured to determine which of the secondary dies to use to fulfill the instructions from the external host device.

21. The packaged memory device of claim 19, wherein the external host device is configured to communicate with the primary memory die without using a chip identification field corresponding to the first and second secondary memory dies.

22. The packaged memory device of claim 19, wherein the primary memory die is configured to compose instruction messages that include an opcode field specifying a memory operation, a chip identification field specifying a particular secondary memory die in a common package with the primary memory die, and one or more operands.

23. The packaged memory device of claim 19, wherein the first secondary memory die is configured to ignore commands from the primary memory die that include the second chip identification, and wherein the second secondary memory die is configured to ignore commands from the primary memory die that include the first chip identification.

24. The packaged memory device of claim 19, further comprising the intra-package interface;
  wherein the primary memory die is configured to generate a reduced-frequency clock signal for the intra-package interface based on a clock signal of the host interface.

25. The packaged memory device of claim 19, wherein the secondary memory dies comprise chalcogenide-based memory cells.

\* \* \* \* \*